SIGNAL MIXING AND CONVERSION APPARATUS EMPLOYING FIELD EFFECT TRANSISTOR WITH SQUARE LAW OPERATION

Filed Dec. 14, 1965

2 Sheets-Sheet 1

INVENTORS
DANIEL R. VON RECKLINGHAUSEN
LAWRENCE W. FISH, JR.

BY Rines and Rines

ATTORNEYS

INVENTORS
DANIEL R. VON RECKLINGHAUSEN
LAWRENCE W. FISH, JR.

BY Rines and Rines

ATTORNEYS

United States Patent Office 3,348,154

Patented Oct. 17, 1967

3,348,154

SIGNAL MIXING AND CONVERSION APPARATUS EMPLOYING FIELD EFFECT TRANSISTOR WITH SQUARE LAW OPERATION

Lawrence W. Fish, Jr., Hudson, and Daniel R. von Recklinghausen, Arlington, Mass., assignors to H. H. Scott, Inc., Maynard, Mass., a corporation of Massachusetts Filed Dec. 14, 1965, Ser. No. 513,768

10 Claims. (Cl. 325—451)

ABSTRACT OF THE DISCLOSURE

Field effect transistor mixing and converter apparatus in which the sum of the applied signals lies within the voltage range between zero bias voltage and pinch-off voltage, over which the transistor has a square law characteristic, and in which the DC bias is of the order of one-half the pinch-off voltage. Also disclosed are tuned input and output circuits, AGC circuits employing diodes and amplification to vary conversion gain, and multiple gate electrode embodiments.

Figures 1, 2:
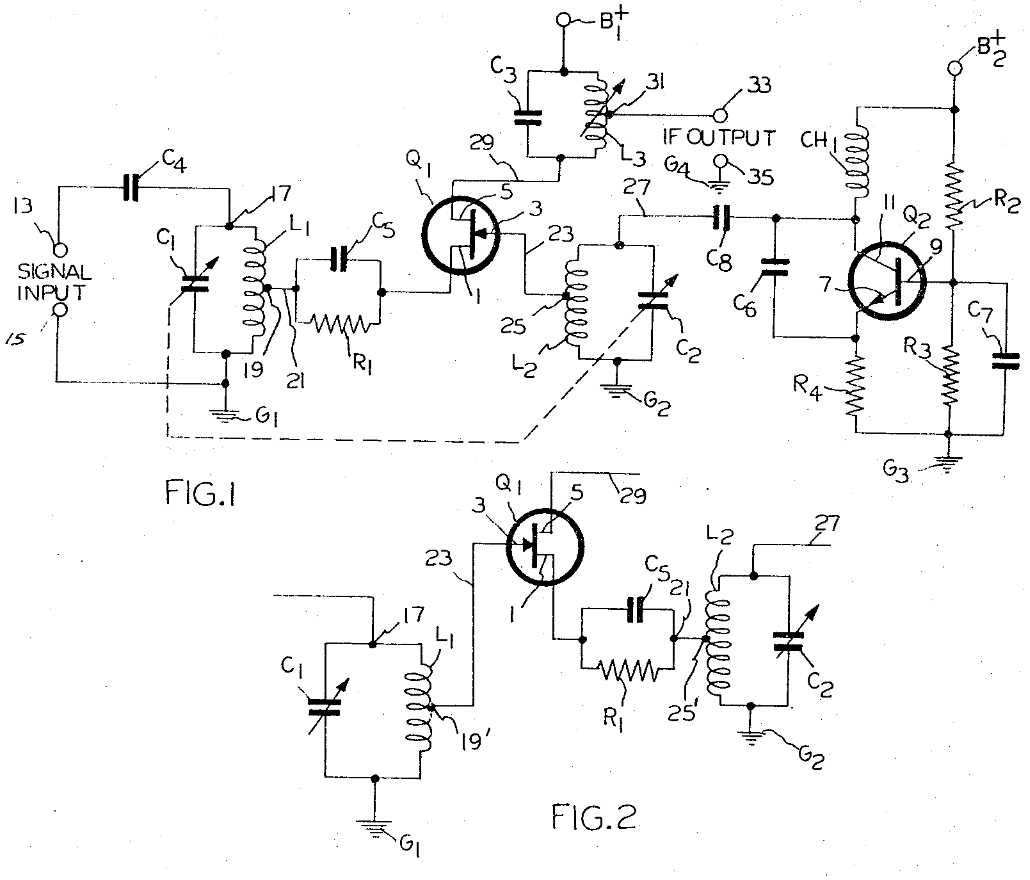

The present invention relates to signal mixing and converter apparatus and, more particularly, to mixer and converter circuits adapted for use in FM broadcast receivers, although the techniques of the invention are equally applicable for other frequency ranges and types of receiving systems.

For many years, oscillator-converter circuits have been employed in radio receivers, usually employing a vacuum tube triode-pentode, triode-hexode, or a pentagrid tube where one section, usually the triode section, served as a local oscillator of a superheterodyne receiver, the other section operating as a mixer. At higher frequencies, usually above 30 mHz., dual triode tubes were often used for the purpose. In the mixer, the local oscillator frequency and the input radio frequency mix to generate the intermediate frequency due to a non-linear transfer characteristic of the mixer itself. In circuits of more recent vintage, diodes and transistors of the bi-polar type have often been employed as mixers.

There are several aspects of performance of a mixer circuit. Of these, conversion gain, residual noise, and the ability to handle large signals have been some of the most important characteristics. In practical converter circuits, one or more of these characteristics has to be compromised in order to gain an advantage in performance of the remaining characteristics. A converter can be described as having a non-linear transfer characteristic consisting of a power series of terms; i.e., the output of the non-linear element being equal to a constant, representing a DC term, a second output proportional to the input signal, a third output term proportional to the square of the input signal, a fourth term proportional to the cube of the input signal, a fifth term proportional to the fourth power of the input signal, etc. With two signals applied to the non-linear element, the term having an output proportional to the square of the input signal results in the sum and the difference between the two input signals being created as the intermediate frequency. This is the major term of interest to the designer of a converter circuit, because one of these signals represents the input radio frequency and the other, the local oscillator frequency. It should be mentioned at this point that the higher order terms, such as cube, fourth power, etc., can also create the intermediate frequency by mixing action between the local oscillator signal and an incoming radio frequency signal, which is not at the same frequency, as desired by normal converter action.

It has been well-documented in the literature describing the theoretical behavior of vacuum tubes that the plate current of a triode tube operating at a fixed plate voltage is proportional to the 3/2 power of the grid bias voltage. One can transform this 3/2 power equation into the above mentioned power series with the result of having not only the DC, fundamental, and square terms occur, but also the cube, fourth power and higher order terms, but of reduced magnitude. This shows that a triode tube is capable of converter action, which it has been for many years, but is also deleteriously subject to overload due to large radio frequency input signals, a factor which also has been struggled with for many years. In order to minimize radio frequency overload, which consists of the generation of spurious responses due to unwanted radio frequency signals, converter designers have most commonly resorted to driving the mixer circuit with a very large local oscillator signal, thereby operating the converter tube, in effect, as a switch. This manner of operation results in high conversion gain and somewhat attenuated susceptibility to large signal overload for signals located subtantially away from the desired input signal frequency. However, a multiplicity of radio frequency signals located near the desired radio frequency will cause spurious responses due to higher order mixing action between these signals and the local oscillator frequency, thereby creating spurious responses due to large interference signals—a problem that can be alleviated to some degree only by placing supplementary selective circuits ahead of the converter, which are designed to filter out the desired radio frequency signal. Since the desired signal has a certain modulation bandwidth (such as 6 mHz. for broadcast television signals), or since radio frequency signals may occupy only a very small fractional bandwidth (such as approximately .15% for FM broadcast signals), radio frequency filtering will be only marginally effective when only two tuned circuits of radio frequency filtering are employed, as is common practice.

Diodes and transistors of the bi-polar variety have a very similar transfer curve, approximated by an exponential function which causes an approximate doubling of current for every 20 mv. instantaneous increase of input voltage. If this exponential function is transformed into the above-mentioned power series, the cube and higher order terms of this series are substantially larger in relation to the lower order terms than those obtained in the analysis of triode vacuum tubes. Consequently, diode and transistor mixers have shown overload problems with substantially lower maximum radio frequency signals even than those employing tube circuits. Consequently, receivers and tuners designed for a large freedom of overload problems usually have had to employ a tube mixer, although the remainder of the receiver circuitry used transistors extensively for such functions as intermediate frequency amplification, audio amplification and for other purposes. Such hybrid circuits, employing both tubes and transistors, disadvantageously require dual power supply circuits to obtain the relatively low voltage for transistor operation and the relatively high voltage required for tube operation.

An ideal converter should have a transfer curve which contains no higher order terms than the square term of the above-mentioned power series.

It has been found that the theoretical transfer curve of a field-effect transistor follows the square-law over a wide region, limited at a zero bias voltage and the pinch-off voltage. At a voltage above zero bias voltage, the gate of a junction field-effect transistor starts to conduct, thereby causing higher order circuit non-linearity. Here, the gate electrode of a field-effect transistor is the control electrode for the device itself. When the reverse gate voltage reaches the pinch-off voltage, the conducting channel within the field-effect transistor is pinched off and ceases to conduct. Any further increase in reverse gate voltage causes no further current reduction and, therefore, the square-law operation of a field-effect transistor is limited by the bounds of zero bias voltage and pinch-off voltage.

At first blush, the possible use of field-effect transistors for these purposes may be considered as contra-indicated in view of the facts, among others, that the zero bias drain current ratings of such devices are known to vary as much as thirty-to-one in manufacturing tolerances, and that the design of these devices has been directed toward achieving constant transconductance. It has been found, however, that for the purposes herein required, it is the pinch-off voltage characteristic and not drain current that is a primary factor in influencing the conversion process and that manufacturing variations therein are only of the order of three-to-one, thus entirely suitable for present purposes. In addition, the efforts of the manufacturers to achieve constant transconductance have been sufficiently unsuccessful to enable advantage to be taken of variations therein to achieve highly successful converter action.

An object of the present invention, accordingly, is to overcome the prior-art problems of spurious responses when handling large input signals without the necessity for additional selective circuits, hybrid combinations of tubes and solid-state devices, or a substantial compromise in noise performance of a converter circuit and, in summary, this end is achieved through the novel utilization of field-effect transistors of transfer characteristic which very nearly follows the square-law described above, bounded by the limits of zero bias voltage and pinch-off voltage.

In order to utilize such a field-effect transistor as a converter, it has been found necessary to adjust the local oscillator signal level to such a magnitude that its peak-to-peak value is substantially equal to, or less than, the two limits described above. Furthermore, the sum of the local oscillator peak-to-peak voltage and the incoming signal peak-to-peak voltage should again be made substantially equal to, or less than, the voltage range described by such limits. If only weak-signal handling capability is to be considered, the peak-to-peak value of the local oscillator voltage can therefore be nearly equal to the pinch-off voltage itself. Since a local oscillator voltage is usually a non-modulated sine-wave signal which has equal positive and negative excursions, the proper DC bias voltage in a field-effect transistor should then be substantially equal to one-half of the pinch-off voltage, thereby preventing instantaneous input signal excursions beyond the above-mentioned limits. Assuming such DC bias voltage substantially equal to one-half of pinch-off voltage and the aforementioned maximum local oscillator signal (as assumed for weak desired signals), operation has been found to result in a conversion transconductance substantially equal to one-fourth of the zero bias transconductance. Since this conversion transconductance is proportional to the local oscillator voltage, any reduction in local oscillator voltage will result in two beneficial performance aspects; namely: the ability to handle the higher input signal and the reduction in conversion gain. The reduction in conversion gain effected by a reduction of local oscillator voltage can thereby be used for automatic gain control of the converter itself. Consequently, while in prior-art normal tubes and transistors, the reduction of the local oscillator voltage increases the susceptibility of overload due to large input signals, in the systems of the invention herein described, the opposite and most desirable effect takes place.

If, however, automatic gain control of the converter circuit is not desirable, a suitable compromise can be reached by operating with a fixed, but reduced, local oscillator signal (from the maximum value described above), thereby achieving a large peak-to-peak signal handling capability substantially equal to the difference between pinch-off voltage and peak-to-peak local oscillator voltage. With the local oscillator voltage adjusted, for example, to have a peak-to-peak voltage substantially equal to one-half of the pinch-off voltage, peak-to-peak signal voltages of the same magnitude can be accommodated with a consequent reduction in conversion gain to one-half of the value determined above.

Up to this point, the maximum signal and local oscillator voltage capability of the input circuit of a field-effect transistor have been described. The output, or drain electrode, of a field-effect transistor has a very high impedance, except at instantaneous drain voltages below the sum of pinch-off voltage and instantaneous gate voltage. Below this point, the drain, or output impedance, decreases rapidly. The instantaneous drain voltage, therefore, should preferably not fall below the pinch-off voltage, because in usual applications the local oscillator frequency and the signal frequency are not coherent, and thus the intermediate frequency is not coherent with either. Practically, this may result in simultaneously having minimum instantaneous drain voltage and zero instantaneous gate voltage.

As is usual practice, the intermediate frequency is obtained at the output circuit of a converter by means of a resonant circuit tuned to the intermediate frequency. Such a circuit may be considered to have an essentially short circuit impedance to all other frequencies, which include the signal and the local oscillator frequency. Only the instantaneous drain voltages due to the intermediate frequency are therefore of interest for determining overload of the drain or output circuit. Here, a maximum peak-to-peak voltage at the intermediate frequency will then be substantially equal to twice the difference between DC supply voltage and the pinch-off voltage.

For operation with weak signals, maximum conversion gain with an ideal field-effect transistor has been found to be obtained when the impedance of the resonant circuit tuned to the intermediate frequency is made as large as possible. Since in actual field-effect transistors the drain impedance is not infinite, but has a large finite value, maximum conversion power gain thus results when the impedance of the aforementioned resonant circuit is made substantially equal to the drain impedance. This value is substantially higher than the value of drain circuit impedance at the intermediate frequency, which would cause both the output and input circuits to go into overload simultaneously for a given large input signal. In order to achieve high overload capability, it is accordingly necessary to adjust the drain circuit impedance to a value substantially equal to the above-mentioned maximum peak-to-peak drain voltage divided by the product of conversion transconductance multiplied by maximum peak-to-peak input signal. If the output circuit impedance, tuned to the intermediate frequency, is adjusted to substantially this value and if, furthermore, the local oscillator voltage is adjusted to substantially one-half of a maximum possible value established above, the ratio of supply voltage to pinch-off voltage then becomes substantially equal to the sum of one-fourth of the conversion voltage gain plus 1.

As a further refinement, the drain circuit impedance at the intermediate frequency may also, in accordance with the present invention, be made adjustable by connecting a shunt element in parallel with the above-described resonant circuit, the valve of which is decreased by means of an automatic volume control circuit. For example, a diode connected in parallel with this circuit, or a portion of it, receiving increasing amounts of forward bias by the automatic gain control circuit, will show a reduced impedance proportional to the inverse of the direct current supplied to it by the automatic gain control circuit, and will, therefore, be useful in reducing the output voltage at the intermediate frequency. Since the conversion gain is equal to the product of conversion transconductance and impedance of the output circuit at the intermediate frequency, a further means of automatic gain control can now be included in this converter circuit.

A further object of the present invention, therefore, is to provide a new and improved converter circuit in which there is provided improved isolation between the signal and oscillator circuits, with an improvement in local oscillator performance when incoming signals in excess of those permitted for linear converter action are encountered.

An additional object is to provide a new and improved field-effect transistor circuit of more general utility, also, it being understood that the term field-effect transistor is herein intended to embrace solid-state and related devices which have the type of characteristics and perform in the manner described.

Other and further objects will be described hereinafter and are more particularly delineated in the appended claims.

The invention will now be described with reference to the accompanying drawings, FIG. 1 of which is a schematic circuit diagram of a preferred embodiment of the invention, illustratively shown as adapted for signal conversion in FM broadcast receivers.

Figure 3:
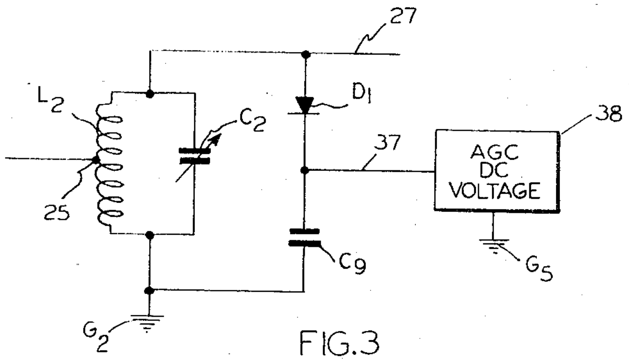
Figure 4:
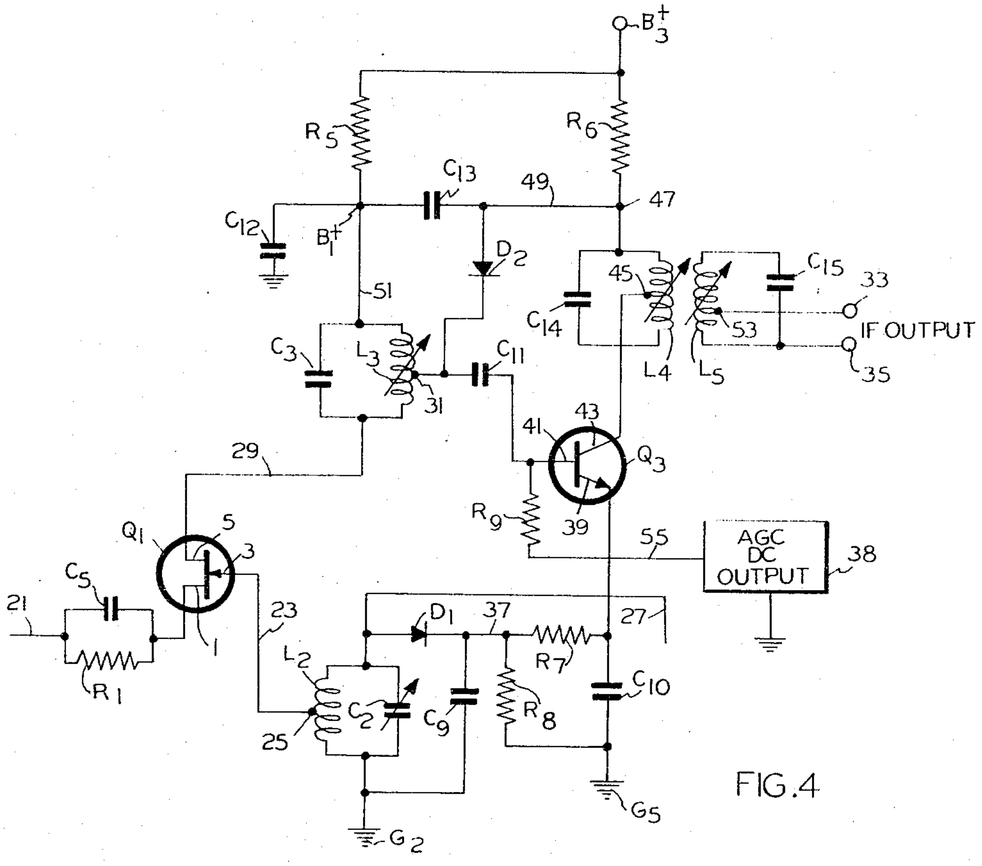
Figure 5:
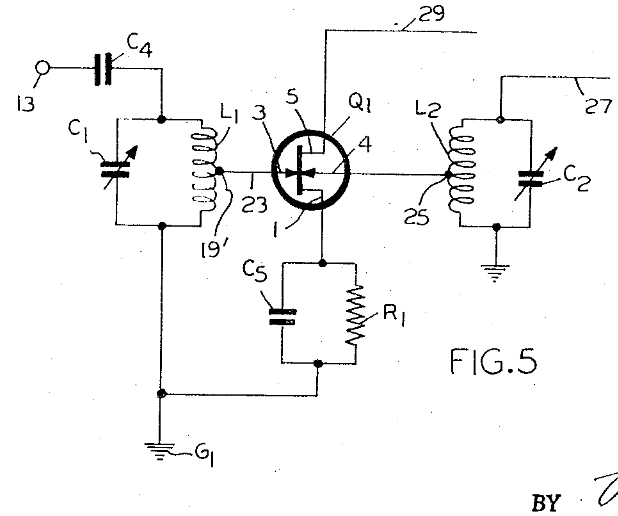

FIGS. 2 and 5 are similar diagrams illustrating alternative circuit connections; and FIGS. 3 and 4 are circuit diagrams of modified AGC connections.

Referring to FIG. 1, the radio-frequency input signal at input terminals 13 and 15 is obtained from an external antenna or from a radio-frequency amplifier stage or similar source, coupled by way of coupling capacitor C4 to a tuned input circuit consisting of capacitor C1 and inductance L1. Capacitor C1 and inductance L1 are tuned to the incoming signal frequency so that a parallel resonant circuit exists between node 17 and ground G1. A field-effect transistor Q1, shown here as an N-channel type field-effect transistor, is used as the converter and has source electrode 1, gate electrode 3, and drain electrode 5.

A portion of the signal alternating-current voltage developed across the input resonant circuit C1–L1 is tapped off at tap 19, located on inductance L1, and the input signal is thence fed by way of capacitor C5 into the source electrode 1 of the field-effect transistor Q1. Proper DC operating bias equal to approximately one-half of the pinch-off voltage of the field-effect transistor Q1 is established by the source resistor R1 connected in parallel with capacitor C5.

Since field-effect transistors can exhibit manufacturing variations in pinch-off voltage, as before explained, a field-effect transistor having the lowest pinch-off voltage is therefore more subject to overload than any of the others; and resistor R1 is thus chosen for the field-effect transistor having the lowest pinch-off voltage. If a field-effect transistor of the higher pinch-off voltage is inserted in the same circuit of FIG. 1, the optimum overload conditions for this particular device will not be reached. But the overload characteristics will still be better than those obtained with a field-effect transistor of very low pinch-off voltage, and with optimum bias as established by resistor R1. Resistor R1, effectively grounded for all direct currents by way of inductance L1, also stabilizes the operating point of field-effect transistor Q1 for variations in tempearture and supply voltage which might otherwise affect the operating point of the field-effect transistor Q1.

Local oscillator alternating-curent voltage is fed to gate electrode 3 of the field-effect transistor Q1 by way of conductor 23 from the tap 25 of inductance L2, forming a resonant circuit tuned to the local oscillator frequency with capacitor C2. One end of this oscillator resonant circuit C2–L2 is grounded at G2. The local oscillator voltage is developed by a transistor Q2 having an emitter electrode 7, base electrode 9, and collector electrode 11. Bias voltage for the transistor Q2 is established by means of voltage divider resistors R2 and R3, with resistor R2 also providing the proper base current for transistor Q2 from the supply voltage $B_2$+. The base electrode 9 is by-passed to ground G3 by way of capacitor C7. Collector supply voltage for transistor Q2 is applied from the voltage source $B_2$+ by way of choke CH1 to collector 11, and the emitter current of transistor Q2 is returned to ground G3 by way of resistor R4. The capacitance between collector electrode 11 and emitter electrode 7 in parallel with an external capacitor C6 and the phase shift between base current and collector current of transistor Q2 will provide an equivalent negative resistance appearing at collector 11 of transistor Q2. The resonant circuit of inductance L2 and capacitor C2 is connected in parallel with this equivalent negative resistance by way of coupling capacitor C8, and therefore transistor Q2 will oscillate at the frequency primarily determined by inductance L2 and capacitor C2. The mode of oscillation of this transistor can be described as the grounded-base mode and the peak-to-peak amplitude of oscillation will be approximately equal to twice the difference between the supply voltage $B_2$+ and the base-to-ground voltage of transistor Q2.

This voltage amplitude of oscillation, however, is generally too high for proper converter action of the field-effect transistor Q1. A portion only of the oscillation voltage is therefore tapped from inductance L2 at connection 25 and is fed by way of conductor 23 to the gate electrode of the field-effect transistor Q1. Supply voltage for the field-effect transistor Q1 is obtained from supply voltage $B_1$+, and the drain current of field-effect transistor Q1 flows from source $B_1$+ by way of inductance L3, and conductor 29, into the drain electrode 5, and is returned to ground from source electrode 1 by way of resistor R1, lead 21 connected to tap 19 of inductance L1, and then the lower part of inductance L1 to ground G1.

Inductance L3 is tuned to the intermediate frequency resulting from conversion in the mixing process within field-effect transistor Q1 by means of capacitor C3; and the intermediate frequency output voltage obtained at tap 31 of inductance L3 is connected to IF output terminals 33 and 35, the latter of which is connected to ground G4. The input signal frequency and the local oscillator frequency are by-passed to ground by way of capacitor C3 connected to source $B_1$+, which is effectively grounded for all frequencies.

While field-effect transistors normally have a high gate input impedance, at frequencies above 30 mHz., lowest noise operation will result when they are driven from a relatively low impedance source; for example, 1000 ohms or less. The available power gain as a radio-frequency amplifier, furthermore, at frequencies above 100 mHz., may be relatively independent of the method of signal connection, whether fed to the source or the gate electrode of the field-effect transistor. For this reason, in the circuit shown in FIG. 1, the signal voltage is fed to the source circuit 1 and the local oscillator voltage is fed to the gate circuit 3. For ease of construction, assembly and alignment, moreover, both the signal and the oscillator circuits are grounded at their respective ground terminals, G1 and G2, thereby avoiding the necessity for any secondary windings on either the input circuit inductance L1 or the oscillator inductance L2. If it should be intended to feed both the input signal and the local oscillator voltage into the gate circuit, and it is desired to avoid the need for secondary windings on either inductance, while still maintaining signal and oscillator circuits grounded at their respective ground terminals, it would be necessary to use such techniques as a double set of small coupling capacitors from each resonant circuit into the gate circuit. This type of connection, however, is generally undesirable because it results in local oscillator frequency changes when the input signal circuit is adjusted and changes, also, in tuned frequency of the input signal circuit when the local oscillator circuit is adjusted for proper frequency. For this reason, the signal is fed into the source electrode 1 and the local oscillator is fed into the gate electrode 3 of field-effect transistor Q1 and only the inter-electrode capacitance will cause coupling between the circuits. This method of connection also has the advantage, when there is an input signal in excess of that permitted by normal operation, that the local oscillator is relatively unaffected because only the instantaneous conduction of current by the effectively instantaneously forward-biased gate electrode 3 will affect the local oscillator operation. It should also be noted that the connections shown in FIG. 1 result in an input impedance comparable to the optimum source impedance for lowest noise operation, thereby reducing the conversion power gain from the maximum amount possible.

In FM tuner operations with a circuit of the type shown in FIG. 1, for example, employing a Texas Instruments N-channel Type 2N3823 field-effect transistor Q1, IHF sensitivities of 1.6 to 2 microvolts were obtained with cross-modulation rejection of from 96 db to more than 100 db. Two strong signals, equivalent to more than 50 mv. per meter and separated by 800 kc. can be fed into the input without having any measurable intermodulation products generated; such performance being more than 20 db better than the best prior-art bipolar transistorized front ends and at least equivalent, and in most cases superior, to the very best prior-art tube front ends, and with the further advantages thereover previously discussed.

If a higher conversion power-gain is required, an alternate connection of field-effect transistor Q1 can be used, as is shown in FIG. 2. Here, the gate electrode 3 of field-effect transistor Q1 is connected to a tap 19′ of the input circuit inductance L1, the tap 19′ generally located closer towards node 17 than the tap 19 of FIG. 1. Local oscillator voltage from the resonant circuit C2–L2 is obtained from tap 25′ by way of conductor 21 through source by-pass capacitor C5 to the source electrode 1. Source bias resistor R1 is connected in parallel with capacitor C5 as described above. In order to provide the same local oscillator injection and conversion transconductance of the circuit of FIG. 2 as compared with the circuit of FIG. 1, the same amount of local oscillator injection voltage has to be maintained. Since, however, the input impedance of field-effect transistor Q1 at its source terminal 1 is lower than the input impedance at the gate terminal 3, tap 25′ will have to be located further away from ground G2 because the local oscillator voltage at conductor 27 will be reduced in view of the amount of increased loading on the local oscillator circuit C2–L2 by the source input impedance of field-effect transistor Q1.

As was mentioned above, the conversion gain of a field-effect transistor is approximately proportional to the amount of local oscillator voltage provided. The amount of conversion gain can thus be adjusted, in accordance with the invention, by varying the local oscillator voltage. One method of accomplishing this is shown in FIG. 3. Local oscillator voltage is there obtained from a circuit similar to that involving transistor Q2 of FIG. 1 and by way of lead 27, oscillator inductance L2 and capacitor C2 forming the resonant network. A diode D1 is also connected to conductor 27 and is returned to ground G2 by way of by-pass capacitor C9. The cathode of diode D1 is also connected by way of conductor 37 to a DC voltage source 38, which may be the automatic gain control DC voltage developed by an AGC detector. When this voltage is positive, as it may be under the conditions of no-signal diode D1 is effectively reverse-biased for all instantaneous voltages except those exceeding the voltage provided by conductor 37. Since a diode in its forward bias operation conducts current increasing by a factor of two for a voltage increase of approximately 20 mv., the peak-to-peak oscillator voltage is thereby limited to a peak-to-peak value of twice the sum of DC voltage provided by conductor 37 and the normal forward voltage drop of diode D1. This normal forward voltage drop is approximately one-quarter of a volt for germanium diodes and approximately six-tenths of a volt for silicon diodes. Any reduction in positive AGC voltage of the DC voltage source 38 toward zero or towards negative values will therefore limit the peak-to-peak local oscillator voltage to progressively lower values by effectively increasing the losses of the local oscillator circuit connected to conductor 27. By this means, a reduction of conversion gain of field-effect transistor Q1 is effectively obtained. The effect of these losses of the local oscillator resonant circuit by different bias voltages of diode D1 will be restricted to the local oscillator frequency because the resonant circuit of inductance L2 and capacitor C2 will be effectively a short circuit for all frequencies other than the local oscillator frequency. In order to get fully effective action of this conversion gain control method, it is desirable that diode D1 be selected so that its change in capacity between its anode and cathode terminals, as anode to cathode voltage is varied, is very small compared to the value of the capacitor C2, so that the local oscillator frequency will not be shifted.

The AGC voltage source for the automatic gain control purposes of diode D1 should have a low internal impedance. Since normal detector circuits for automatic gain control may have too high an impedance, it is therefore possible and practical to use another stage subject to automatic gain control as a direct-current amplifier to operate diode D1. This is shown in FIG. 4. Here, transistor Q3, the first intermediate-frequency amplifier, has emitter electrode 39, base electrode 41, and collector electrode 43, and receives automatic gain control voltage from AGC source 38 by way of conductor 55 and resistor R9 connected to the base electrode 41. The emitter is returned to ground G5 for all high frequencies, including intermediate frequencies, by way of by-pass capacitor C10, and for direct currents by way of voltage divider resistors R7 and R8. The junction of resistors R7 and R8 now provides the direct control voltage to diode D1 by way of conductor 37. As above, local oscillator voltage, with inductance L2 and capacitance C2 forming the frequency-determining circuit for the local oscillator, is still provided by way of conductor 27. Diode D1 is again by-passed from its cathode terminal to ground by way of capacitor C9. The internal impedance of the voltage source now controlling diode D1 lies between the value of resistor R8 itself and the value of the parallel combination of resistors R7 and R8. The exact value is dependent upon the internal impedance of the AGC voltage source 38 in series with resistor R9, and the direct current gain of transistor Q3.

As mentioned above, the maximum conversion power gain exists when the impedance of the intermediate frequency network connected in the output circuit of a field-effect transistor matches the impedance of the drain electrode. It was also stated that maximum overload capability of the field-effect transistor converter exists when the impedance of the circuit tuned to the intermediate frequency connected to the drain electrode of the field-effect transistor is reduced to a value so that the instantaneous peak-to-peak voltage across this network is equal to more than twice the difference between the supply voltage and the pinch-off voltage of the field-effect transistor. If it is desirable to have both the maximum possible conversion gain for weak signals and the ability to handle the strongest input signals, it is therefore desirable to vary the impedance of the intermediate frequency network connected to the output circuit of the field-effect transistor in accordance with the received signal voltages, and thereby also effect some further automatic gain control. This is also shown in FIG. 4 where the automatic gain control voltage, applied by way of conductor 55 and resistor R9 to the first intermediate frequency amplifier stage Q3, results in a voltage variation at its emitter electrode 39 with respect to ground G5. This same emitter voltage variation can be thought to be an emitter current variation which is very nearly equal to the value of collector current variation of the same transistor Q3. In this stage, collector current for transistor Q3 is supplied from voltage source $B_3$+ by way of filter resistor R6 to node 47, inductance L4, tap 45, to the collector electrode 43 of transistor Q3. Inductance L4 is tuned to the intermediate frequency by means of capacitor C14, and intermediate frequency output at terminals 33, 35 is obtained from coupled-inductance L5 tuned with capacitor C15 also to the intermediate frequency. Any variation in the DC voltage conductor 55 due to the variations in voltage of the AGC voltage source 38 therefore causes varying voltage drop across resistor R6. Supply voltage source $B_1$+ of the field-effect transistor Q1 is obtained from supply voltage source $B_3$+ by way of resistor R5 connected to lead 51 of the intermediate-frequency tuned circuit C3–L3, and is also by-passed to ground by capacitor C12. The effective collector supply voltage at node 47 for transistor Q3 is also effectively by-passed to ground by way of conductor 49 and capacitor C13 in series with capacitor C12 connected to ground.

If the AGC voltage source 38 changes its value from a positive voltage towards a less positive voltage, the voltage drop across resistor R6 will be reduced. Under normal conditions with very weak input signals, the voltage drop across resistor R6 is larger than the voltage drop across resistor R5 and therefore diode D2 will be reverse-biased. Diode D is connected to node 47 by way of conductor 49 at its anode end. The cathode end of diode D2 is connected to tap 31 of inductance L3 which has the same DC voltage as conductor 51, or for that matter, voltage source $B_1$+. Reverse biased diode D2 will therefore exert no damping effect on resonant circuit C3–L3, which will then have a high impedance.

The aforementioned reduction in current through transistor Q3 by a more negative voltage of AGC voltage source 38 can thereby reduce the voltage drop across resistor R6 which will cause the anode electrode of diode D2, connected to conductor 49, to reach a positive voltage with respect to its cathode and voltage source $B_1$+, and diode D2 will begin to conduct. Increased conduction will show a lower dynamic resistance and therefore an effective damping resistance connected in parallel with a portion of inductance L3 between terminal 31 and conductor 51 by way of capacitor C13. Any further reduction in collector current of transistor Q3 to the point of almost complete cut-off, will then cause field-effect transistor Q1 to be supplied with direct current from supply voltage $B_3$+ by the parallel combination of resistor R5 and resistor R6 in series with diode D2 as far as direct operating currents are concerned. Under these conditions diode D2 will have its minimum resistance and the resonant circuit L3 in parallel with capacitor C3 will also have its minimum resonant parallel impedance. By appropriate choice of operating currents of field-effect transistor Q1 and IF amplifier transistor Q3 and supply filter resistors R5 and R6, respectively, the effective parallel impedance of the IF resonant circuit of inductance L3 and capacitance C3 can be calculated through the knowledge that the dynamic impedance of a semiconductor diode is equal to approximately 26 ohms with 1 ma. of current through diode D2 and half that amount with the double current. This effective dynamic resistance can then be multiplied by the ratio of the square of the total turns of inductance L3 to the number of turns from tap 31 to conductor 57 of inductance L3 to arrive at the effective parallel impedance of this tuned circuit. Again, diode D2 should be chosen so that its capacitance variations from reverse to forward bias cause an insignificant amount of detuning of the aforementioned circuit resonant at the intermediate frequency.

For operation in the FM band of 88 to 108 megacycles, certain diodes may exhibit too large a viaration in capacitance to be useful for control of local oscillator voltage, and therefore detuning by diode D1. Under these circumstances, the local oscillator voltage may be adjusted to a fixed value, as shown in FIG. 1, and only the diode D2 may be used for automatic gain control purposes.

While a normal field-effect transistor may be considered to consist of a bar of semiconductor material with source and drain electrodes attached to both ends of the bar and with gate electrode consisting of two parallel-connected surfaces attached to the sides of the bar to form a single, accessible gate electrode terminal, it is possible that the two gate electrodes be not connected together within the field-effect transistor, but have separate terminals. Such field-effect transistors may be described as tetrode-type field-effect transistors. These devices can be used equally well in the circuits described in FIGS. 1 through 4 by externally connecting the two gate electrodes together and treating them as a single gate electrode. The availability of a second gate electrode makes it possible, however, to connect the signal to one gate electrode 3 by way of conductor 23 and tap 19′, and the local oscillator voltage to the second gate electrode 4 from tap 25 of the local oscillator inductance L2, FIG. 5. The source electrode 1 is returned directly to ground G1 by means of the parallel combination of by-pass capacitor C5 and resistor R1. By this means, the local oscillator circuit and the signal circuit are effectively isolated from each other, being coupled only by the interelectrode capacitance between the first gate 3 and the second gate 4. The loading on the input signal circuit will be that shown in FIG. 2 and the loading of the oscillator circuit will be that shown in FIG. 1. This method of connection, using a tetrode field-effect transistor, will result in superior selectivity. The amount of conversion gain may be comparable to that of FIG. 1 because only the transconductance of gate 3 will be varied by the local oscillator voltage, rather than the transconductance of both gates connected in parallel. The improved input impedance and reduced circuit loading of inductance L3 and capacitor C1, however, will compensate in large part for this loss.

Since a field-effect transistor is usually of symmetrical construction, as evident in the physical description of a field-effect transistor given above, it is therefore possible to interchange the source and drain connections of field-effect transistors Q1 shown in all these figures. This interchange of connections can be beneficial because lead break-out from the field-effect transistor will result in slightly different leakage-inductances and stray capacitances of the device itself, and may be used for optimum circuit layout by using the more convenient electrode.

The oscillator converter circuits shown therefore permit the construction of high performance receivers without the need of additional protective measures, such as further selective input circuits or automatic gain control amplifiers ahead of the converter. It is not intended to restrict the application of these circuits to the reception of FM broadcasts in a range of 88 to 108 megacycles, because much broader applications are easily accomplished. Further modifications will also occur to those skilled in the art, and all such are considered to fall within the spirit and scope of the invention as defined in the appended claims.

What is claimed is:

1. Signal mixing apparatus having, in combination, field-effect transistor means provided with source, drain and gate electrode means and a substantially square-law characteristic extending over the predetermined voltage range between zero bias voltage and pinch-off voltage of said transistor means, a pair of input circuits connected with the source and gate electrode means for respectively applying to and mixing within the field-effect transistor means a pair of alternating-current voltages of peak-to-peak values the sum of which lies substantially within said range, means for establishing a D.C. bias for said transistor means of the order of substantially one-half the pinch-off voltage, and an output circuit connected with said drain electrode means for withdrawing the resultant of the said mixing.

2. Apparatus as claimed in claim 1 and in which each input circuit is provided with a pair of terminals one of which is grounded, the other terminals being respectively connected to source and gate electrodes of the said electrode means.

3. Apparatus as claimed in claim 1 and in which each input circuit is provided with a pair of terminals one which is grounded, the other terminals being respectively connected to a pair of gate electrodes comprising the said gate electrode means, the said source electrode means being coupled to said grounded terminals.

4. Apparatus as claimed in claim 1 and in which each of said input and output circuits comprises a tuned circuit substantially resonant to the corresponding alternating-current voltage therein, and means is provided responsive to variations in the peak-to-peak voltage of one of said alternating-current voltages and connected with the corresponding tuned circuit therefor for effectively correspondingly varying the mixing gain of the field-effect transistor means.

5. Apparatus as claimed in claim 1 and in which each of said input and output circuits comprises a tuned circuit substantially resonant to the corresponding alternating-current voltage therein and said output tuned circuit is provided with means responsive to direct-current voltage control means for adjusting the output circuit impedance correspondingly to vary the mixing gain of the field-effect transistor means.

6. Apparatus as claimed in claim 1 and in which one of said alternating-current voltages comprises a received radio-frequency signal and the other comprises locally generated oscillations, the said output circuit being tuned to an intermediate frequency resulting from the conversion of the said signal by square-law non-linear mixing with said oscillations in the field-effect transistor means.

7. Apparatus as claimed in claim 6 and in which each of the input and output circuits is provided with a tuned circuit substantially resonant to the corresponding alternating-current voltage therein and the said tuned circuit resonant to the said locally generated oscillations is provided with means responsive to variations in the peak-to-peak voltage of said oscillations for effecting corresponding variations in the conversion gain of the field-effect transistor means.

8. Apparatus as claimed in claim 7 and in which said responsive means comprises diode means connected with by-pass means across the said tuned circuit resonant to the said locally generated oscillations and automatic gain control direct-current voltage means is connected between said diode and by-pass means.

9. Apparatus as claimed in claim 6 and in which each of the input and output circuits is provided with a tuned circuit substantially resonant to the corresponding alternating-current voltage therein and the said tuned output circuit resonant to said intermediate frequency is connected with voltage-responsive means for adjusting the impedance thereof correspondingly to vary the conversion gain of the field-effect transistor means.

10. Apparatus as claimed in claim 9 and in which said tuned output circuit is connected with intermediate frequency amplifying means and diode means controllable thereby and connected to vary the effective output circuit impedance as presented to the drain electrode means, and automatic gain control direct-current voltage means being provided for controlling said amplifying and thus said diode means.

References Cited

UNITED STATES PATENTS

| | | | |
|---|---|---|---|
| 2,836,797 | 5/1958 | Ozarow | 332—52 |
| 3,229,120 | 1/1966 | Carlson | 307—88.5 |
| 3,281,699 | 10/1966 | Harwood | 325—440 |

KATHLEEN H. CLAFFY, *Primary Examiner.*

WILLIAM C. COOPER, *Examiner.*

R. S. BELL, *Assistant Examiner.*